(12) United States Patent
Chen et al.

(10) Patent No.: US 7,342,260 B2
(45) Date of Patent: Mar. 11, 2008

(54) LIGHT EMITTING DIODE

(75) Inventors: Hsueh-Shih Chen, Hsinchu (TW); Gwo-Yang Chang, Jiali Township, Tainan County (TW); Chien-Ming Chen, Yangmei Township, Taoyuan County (TW); Jun-Ren Lo, Hsinchu (TW); Shyh-Yang Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 239 days.

(21) Appl. No.: 11/020,764

(22) Filed: Dec. 23, 2004

(65) Prior Publication Data

US 2005/0139852 A1     Jun. 30, 2005

(30) Foreign Application Priority Data

Dec. 26, 2003   (TW) ............................. 92137022 A

(51) Int. Cl.
   *H01L 29/22*     (2006.01)
(52) U.S. Cl. ..................... 257/99; 257/98; 257/100; 257/E33.059; 257/E33.06; 257/E33.061; 313/501; 313/502; 313/503; 313/512; 428/690; 428/917

(58) Field of Classification Search ................ 313/491, 313/501, 502, 503, 512; 438/29; 257/98, 257/99, 100, E33.059, E33.06, E33.061; 428/690, 917
See application file for complete search history.

(56) References Cited

U.S. PATENT DOCUMENTS 6,207,229 B1 * 3/2001 Bawendi et al. ............ 427/215
2002/0151094 A1 * 10/2002 Andriessen ................. 438/29
2003/0227249 A1 * 12/2003 Mueller et al. ............. 313/491

* cited by examiner

*Primary Examiner*—Minhloan Tran
*Assistant Examiner*—Benjamin Tzu-Hung Liu
(74) *Attorney, Agent, or Firm*—Thomas, Kayden, Horstemeyer & Risley

(57) ABSTRACT

A light emitting diode. The light emitting diode comprises a lead frame and an LED chip therein. Packaging material in the lead frame is covers the LED chip. A plurality of ZnX quantum dots dispersed in the packaging material, wherein X is S, Se, Te or a combination thereof. A plurality of organic molecules covers each ZnX quantum dot.

14 Claims, 5 Drawing Sheets

LIGHT EMITTING DIODE

BACKGROUND

The invention relates to a light emitting diode (LED), and more particularly to a ZnX LED, where X is S, Se, Te or a combination thereof.

Light emitting diodes are used as display and lighting devices. Working principles comprise voltage applied to a diode to drive electron and hole combinations, releasing light from the diode. Luminescence characteristics, such as color and intensity, are based on energy gap and quantum efficiency of the luminescent materials.

A popular LED structure is shown in FIG. 1, in which LED 10 comprises a lead frame 11, a GaN LED chip 12 therein, and a packaging material 13 covering GaN LED chip 12. A plurality of YAG phosphors 14 are dispersed in packaging material 13. YAG phosphors 14 are synthesized at high temperature (>1000° C.), creating large particles.

YAG phosphors 14 also present poor dispersion due to incompatebility with packaging material 13, negatively affecting luminescent uniformity.

It is desirable to resolve these and other problems and obtain higher luminescent efficiency for the LED.

SUMMARY

Accordingly, embodiments of the invention provide a light emitting diode.

The light emitting diode comprises a lead frame and a LED chip therein. Packaging material in the lead frame covers the LED chip. A plurality of ZnX quantum dots is dispersed in the packaging material, wherein X is S, Se, Te or a combination thereof. A plurality of organic molecules covers each ZnX quantum dot.

DESCRIPTION OF THE DRAWINGS

The invention can be more fully understood by reading the subsequent detailed description and examples with references made to the accompanying drawings, wherein.

DETAILED DESCRIPTION

Figure 1:
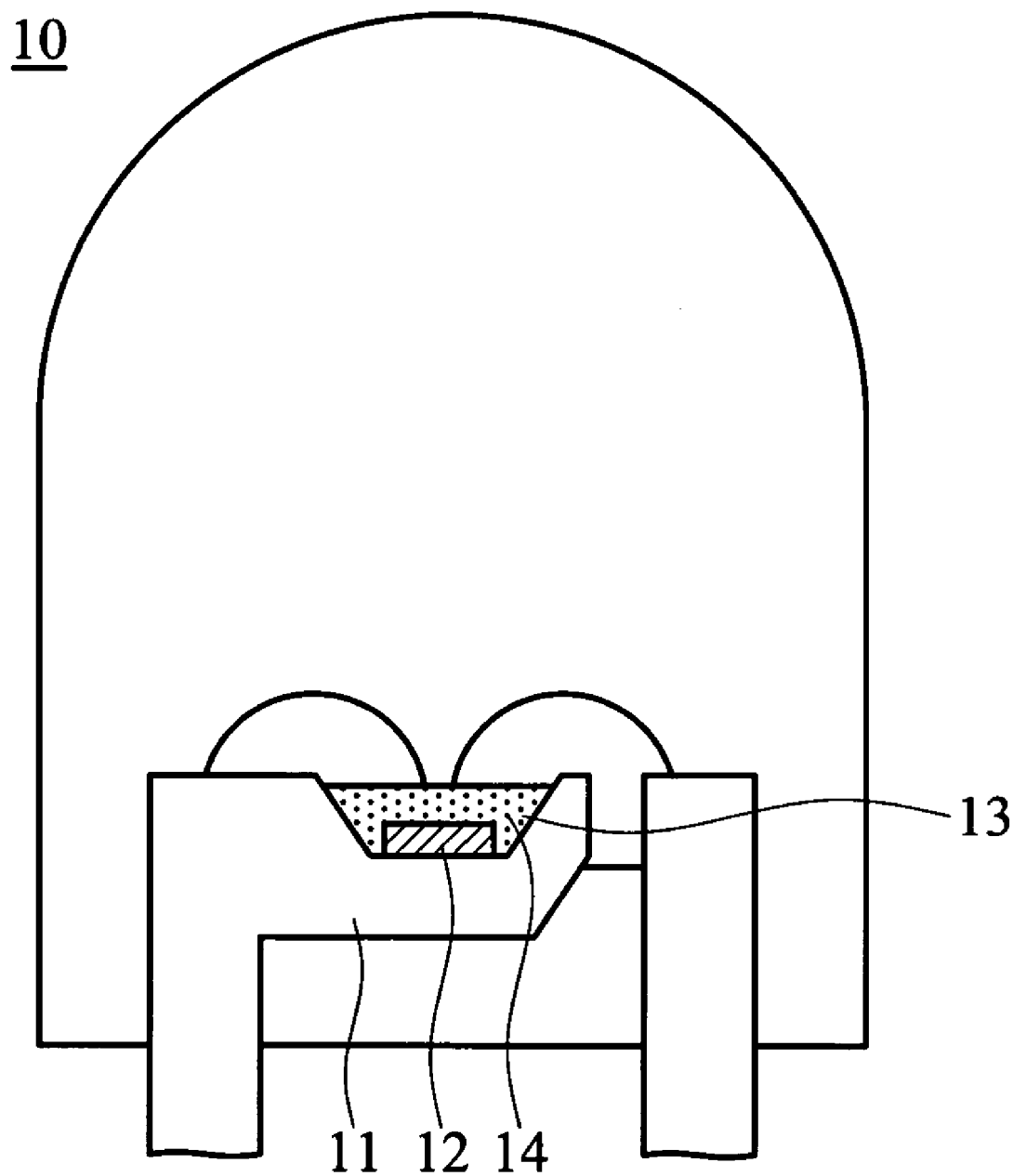
FIG. 1 is a cross-section of a conventional LED structure.
Figure 2:
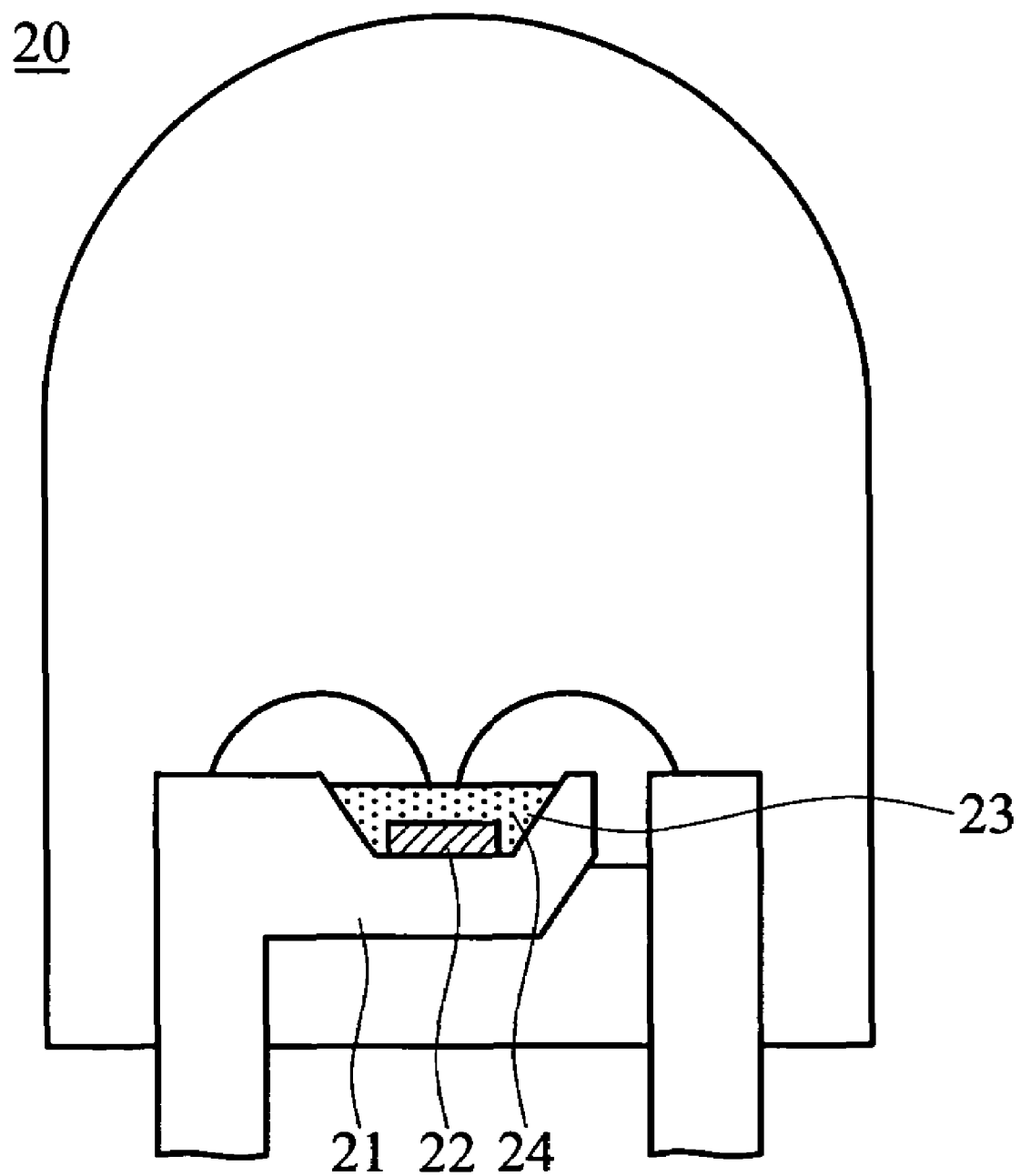
FIG. 2 is a cross-section of a LED structure of the embodiments.
Figure 3:
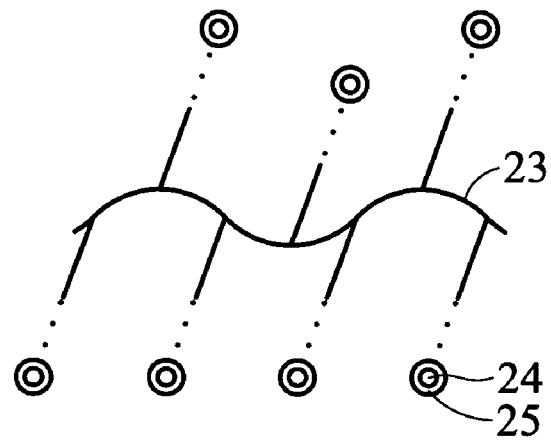
FIG. 3 is a schematic illustrating interaction between the phosphors and the coating materials of the embodiments.

The light emitting device structure of the embodiments is shown in FIG. 2. Light emitting device 20 comprises a lead frame 21, a LED chip 22 in lead frame 21, and packaging material 23 in lead frame 21 and covering LED chip 22. Packaging material 23 may be resin or epoxy. A plurality of ZnX quantum dots 24 is dispersed in packaging material 23, where X is S, Se, Te or a combination thereof. ZnX quantum dot 24 is smaller than 20 nm. Furthermore, ZnX quantum dots 24 may be doped by dopants, such as transition elements, halogens or a combination thereof. A plurality of organic molecules 25 covers the each ZnX quantum dot 24 to form a core/shell structure, as shown in FIG. 3. Organic molecules 25 comprise aliphatic compounds or phospholipids. Organic molecules 25 interact with packaging material 23, to improve ZnX quantum dot 24 dispersion, even to nano-scale dispersion. In other words, ZnX quantum dots 24 dispersed in the packaging material 23 form a plurality of clusters wiht each cluster is smaller than 100 nm.

EXAMPLE 1—ZnSe LED 0.3158 g Se powder was put in a vacuum environment to remove moisture, and inert gas was injected from oxidation. 5 ml tri-octylphosphine (TOP) was added and treated ultrasonically for 30 mins to obtain a colorless TOPSe complex solution.

0.324 g ZnO was put in a three-necked bottle and heated to 120° C. in inert gas to remove moisture. After cooling to room temperature, 1.4693 g tri-octylphosphine oxide (TOPO) and 2 g stearic acid (SA) were added and heated to 150° C. for 20 mins to obtain a transparent solution.

The ZnO solution was heated to 300° C., and the TOPSe solution was added to form ZnSe quantum dots covering the stearic acid (SA) molecules.

The 10 wt. % and 20 wt. % ZnSe quantum dots were mixed with epoxy to form two mixtures. The two mixtures were coated onto two GaN LED chips respectively to form two ZnSe LEDs.

Figure 4:
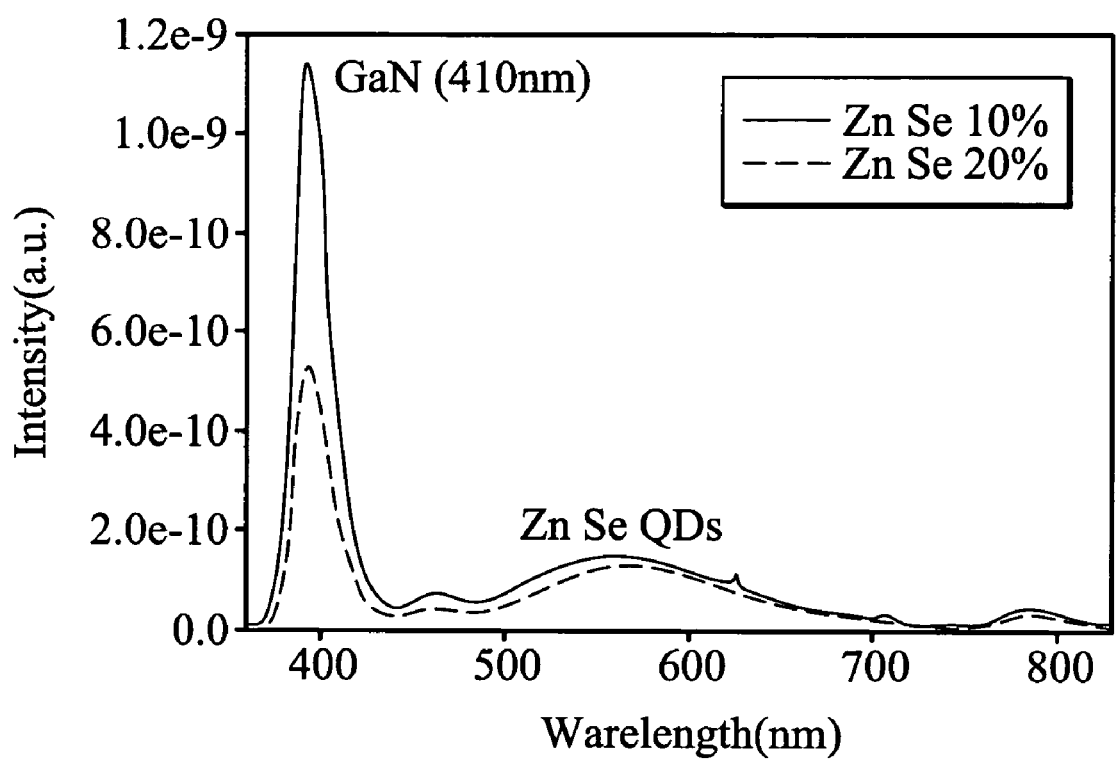
FIG. 4 is a ZnSe LED PL spectrum of example 1.

FIG. 4 is a PL spectrum of the ZnSe LEDs. The luminescent intensity of the 10 wt. % ZnSe quantum dots LED is higher than the 20 wt. % ZnSe quantum dots LED.

The CIE chromaticity coordinates are (0.3840872, 0.3831313) and (0.3824845, 0.4137564) respectively, with the two LEDs shown both white LEDs.

EXAMPLE 2—ZnS LED 0.0321 g S powder was put in a vacuum environment to remove moisture, and inert gas was injected from oxidation. 1 ml tri-octylphosphine (TOP) was added and treated ultrasonically for 30 mins to obtain colorless TOPS complex solution.

0.081 g ZnO was put in a three-necked bottle and heated to 120° C. in inert gas to remove moisture. After cooling to room temperature, 0.7422 g tri-octylphosphine oxide (TOPO) and 11.4 g stearic acid (SA) were added and heated to 150° C. for 20 mins to obtain a transparent solution.

The ZnO solution was heated to 300° C., and the TOPS solution was added to form ZnS quantum dots covering the stearic acid (SA) molecules.

The ZnS quantum dots were mixed with epoxy to form a mixture. The mixture was coated onto a GaN LED chip to form a ZnS LED.

Figure 5:
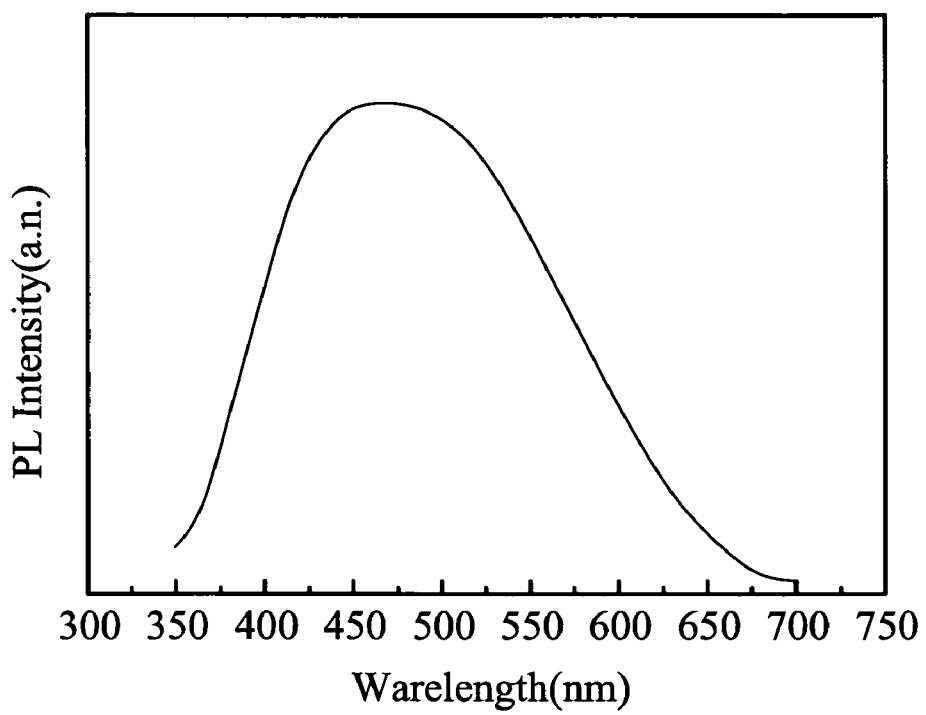
FIG. 5 is a ZnS LED PL spectrum of example 2.

FIG. 5 is a PL spectrum of the ZnS LED.

EXAMPLE 3—ZnTe LED 1.276 gTe powder was put in a vacuum environment to remove moisture, and inert gas was injected from oxidation. 15 ml tri-octylphosphine (TOP) was added and the solution was treated ultrasonically for 30 mins to obtain a green TOPTe complex solution.

1.215 g ZnO was put in a three-necked bottle and heated to 120° C. in inert gas to remove moisture. After cooling to room temperature, 23.199 g tri-octylphosphine oxide (TOPO) and 1.0016 g stearic acid (SA) were added and heated to 150° C. for 20 mins to obtain a transparent solution.

The ZnO solution was heated to 300° C., and the TOPTe solution was added to form ZnTe quantum dots covering the lauric acid (LA) molecules.

The ZnTe quantum dots were mixed with epoxy to form a mixture. The mixture was coated onto a GaN LED chip to form a ZnTe LED.

Figure 6:
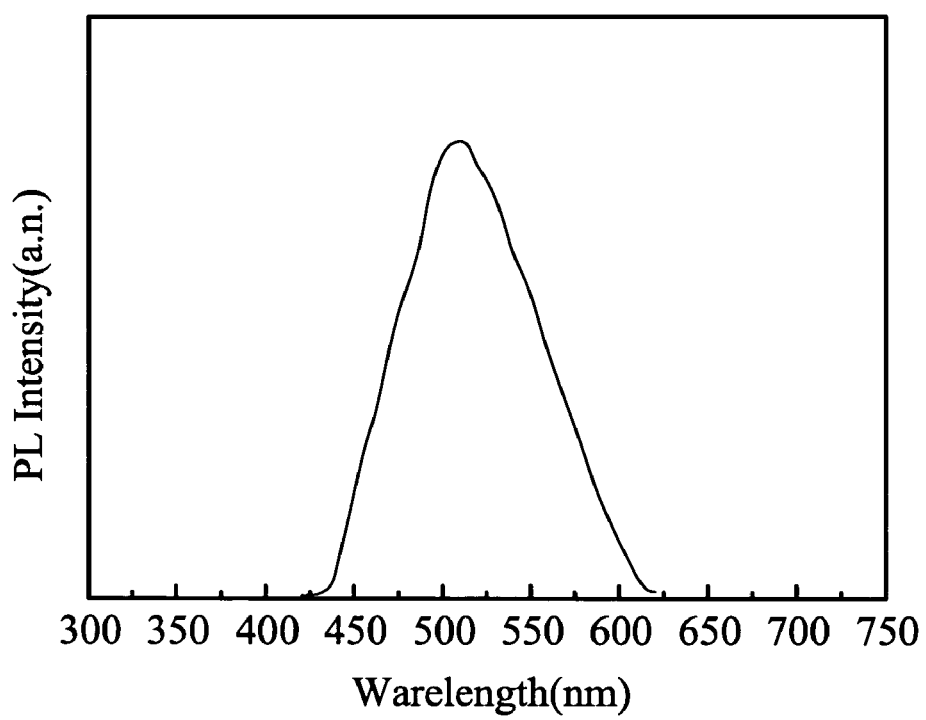
FIG. 6 is a ZnTe LED PL spectrum of example 3.

FIG. 6 is a PL spectrum of the ZnTe LED.

EXAMPLE 4—ZnSe:I LED

The TOPSe complexes solution was prepared according to example 1.

ZnO was put in a three-necked bottle and heated to 120° C. in inert gas to remove moisture. After cooling to room temperature, hexadecylamine (HDA) and stearic acid (SA) were added and heated to 150° C. for 20 mins to obtain a transparent solution.

$I_2$ was added tri-octylphosphine (TOP) to obtain a $I_2$/TOP solution.

The ZnO solution was heated to 300 ° C. for 10 min, the TOPSe complex solution and 0.5 ml $I_2$/TOP solution were add at 260° C. for 20 min then cooled to room temperature to form ZnSe:I quantum dots covering the lauric acid (LA) molecules.

The ZnSe:I quantum dots were mixed with epoxy to form a mixture. The mixture was coated onto a GaN LED chip to form a ZnSe:I LED.

Figure 7:
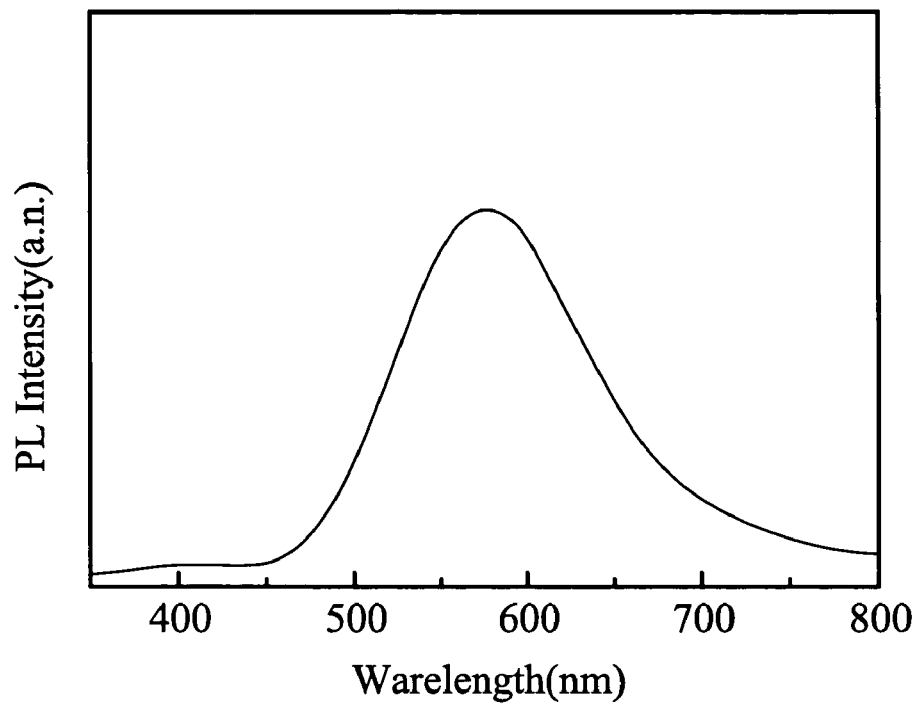
FIG. 7 is a ZnSe:I LED PL spectrum of example 4.

FIG. 7 is a PL spectrum of the ZnSe:I LED.

EXAMPLE 5—ZnSe:Mn LED

The ZnSe:Mn LED was prepared as in examples 2 and 4, except for substitution of $Mn(NO_3)_2$. for $I_2$.

Figure 8:
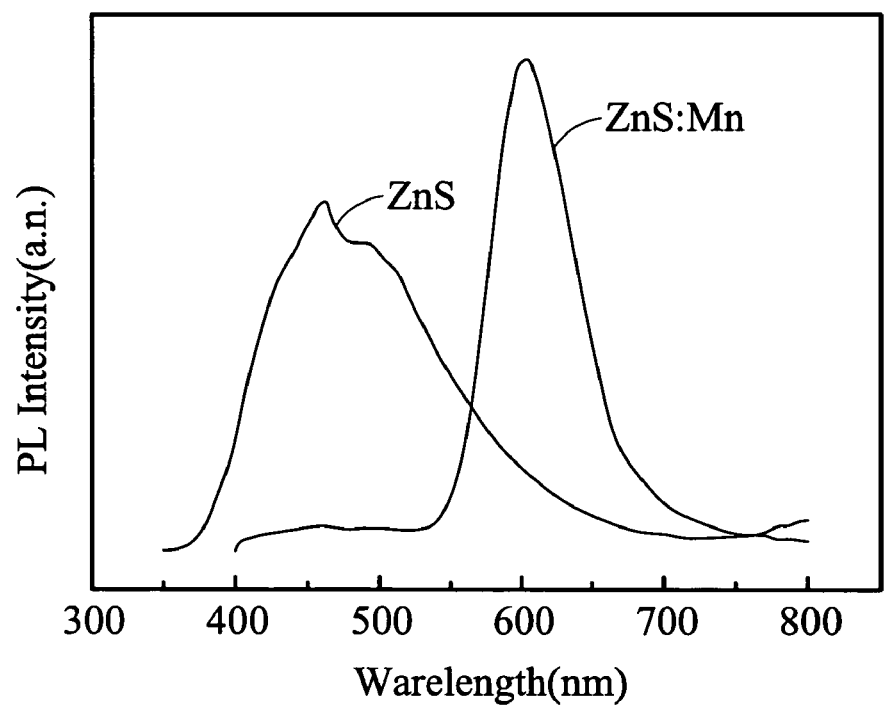
FIG. 8 is a ZnS LED and ZnS:Mn LED PL spectrum of example 5.

FIG. 8 is a PL spectrum of the ZnS:Mn LED and ZnS LED.

The ZnX LED comprises the following features:

1. ZnX quantum dots improve the luminescent efficiency of the LED due to the quantum confinement effect of the quantum dots.

2. Luminescent characteristics are controlled by the energy gap of the quantum dot. One of the factors for controlling the energy gap is particle size. Therefore, various color LEDs can be obtained using different size quantum dots.

3. Conventional LED luminescent materials often have poor dispersion, causing non-uniform luminescence. In the present invention, each ZnX quantum dot is covered by organic molecules, and the organic molecules interact with the packaging materials to promote ZnX quantum dot dispersion, even to nano-scale dispersion.

4. The organic materials that cover the ZnX quantum dots preserve of the ZnX quantum dots. Thus, the ZnX quantum dots are more stable in LED.

What is claimed is:

1. A light emitting diode, comprising:
   a lead frame;
   an LED chip in the lead frame;
   packaging material in the lead frame covering the LED chip;
   a plurality of ZnX quantum dots dispersed in the packaging material, wherein X is S, Se, Te or a combination thereof; and
   a plurality of organic molecules, other than the packaging material, covering each ZnX quantum dot;
   wherein the organic molecules are aliphatic compounds or phospholipids.

2. The light emitting diode as claimed in claim 1, wherein the packaging material comprises resin or epoxy.

3. The light emitting diode as claimed in claim 1, wherein the ZnX quantum dot is smaller than 20 nm.

4. The light emitting diode as claimed in claim 1, wherein the ZnX quantum dots are further doped with a dopant.

5. The light emitting diode as claimed in claim 4, wherein the dopant comprises transition elements, halogens or a combination thereof.

6. The light emitting diode as claimed in claim 1, wherein the ZnX quantum dots dispersed in the packaging material form a plurality of clusters, each cluster smaller than 100 nm.

7. A white light emitting diode, comprising:
   a lead frame;
   an LED chip in the lead frame;
   packaging material in the lead frame covering the LED chip;
   a plurality of ZnX quantum dots dispersed in the packaging material, wherein X is S, Se, Te or a combination thereof; and
   a plurality of organic molecules, other than the packaging material, covering each ZnX quantum dot;
   wherein the organic molecules are aliphatic compounds or phospholipids.

8. The light emitting diode as claimed in claim 7, wherein the packaging material comprises resin or epoxy.

9. The light emitting diode as claimed in claim 7, wherein the ZnX quantum dot is smaller than 20 nm.

10. The light emitting diode as claimed in claim 7, wherein the ZnX quantum dots are further doped with a dopant.

11. The light emitting diode as claimed in claim 10, wherein the dopant comprises transition elements, halogens or a combination thereof.

12. The light emitting diode as claimed in claim 7, wherein the ZnX quantum dots dispersed in the packaging material form a plurality of clusters, each cluster smaller than 100 nm.

13. the light emitting diode as claimed in claim 12, wherein the LED chip comprises GaN, ZnSe or SiC.

14. The light emitting diode as claimed in claim 7, wherein the LED chip comprises GaN, ZnSe or SiC.

* * * * *